(12) United States Patent
Chang et al.

(10) Patent No.: US 11,275,126 B2
(45) Date of Patent: Mar. 15, 2022

(54) TEST SYSTEM, TRANSMITTING DEVICE, AND RECEIVING DEVICE CAPABLE OF PERFORMING MULTIPLE TESTS IN AC COUPLING MODE

(71) Applicant: REALTEK SEMICONDUCTOR CORPORATION, Hsinchu (TW)

(72) Inventors: Feng-Cheng Chang, Hsinchu (TW); Xiao-Guo Zheng, Suzhou (CN); Wei-Xiong He, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/912,109

(22) Filed: Jun. 25, 2020

(65) Prior Publication Data
US 2021/0011091 A1     Jan. 14, 2021

(30) Foreign Application Priority Data
Jul. 12, 2019    (CN) .......................... 201910631269.2

(51) Int. Cl.
*G01R 31/52*        (2020.01)
(52) U.S. Cl.
CPC ................... *G01R 31/52* (2020.01)
(58) Field of Classification Search
CPC ........ G01R 31/52; G01R 31/50; G01R 31/54; G01R 31/55; G01R 31/56; G01R 31/2812; G01R 31/2822
See application file for complete search history.

(56) References Cited

U.S. PATENT DOCUMENTS 8,026,726 B2    9/2011  Sul et al.
9,964,593 B1 *  5/2018  Fortin ............ G01R 31/318566
(Continued)

FOREIGN PATENT DOCUMENTS

CN        102292647 A    12/2011
DE           3805757 A1 *  9/1989  ............. G01R 31/54
(Continued)

OTHER PUBLICATIONS

OA letter of the counterpart TW application (appl. No. 108127117) mailed on Jul. 20, 2020. Summary of the OA letter: Claims 1-10 are rejected as being unpatentable over the cited reference 1 (CN 102292647A, also published as U.S. Pat. No. 8,026,726B2) in view of the common knowledge of this technical field.

*Primary Examiner* — Patrick Assouad
*Assistant Examiner* — Demetrius R Pretlow
(74) *Attorney, Agent, or Firm* — WPAT, PC

(57) ABSTRACT

A test system includes a transmitter, capacitor, and receiver. The transmitter includes: an output circuit coupled to the receiver via the capacitor; a transmitting circuit transmitting a predetermined signal to a pad of the output circuit during a first test; a signal generator outputting a first signal and second signal to the pad during a first process and second process of a second test; and a comparator comparing the pad's signal with a reference signal in the first process and second process to determine whether the second test passes. The receiver includes: an input circuit coupled to the transmitter via the capacitor; a switch coupled between the input circuit and a receiving circuit to be conducting in the first test and second process and nonconducting in the first process; and the receiving circuit determining whether the first test passes according to the predetermined signal and assisting the capacitor in discharging.

20 Claims, 16 Drawing Sheets

(56) References Cited

U.S. PATENT DOCUMENTS

| | | | | |
|---|---|---|---|---|
| 2002/0170011 A1* | 11/2002 | Lai | ............... | G01R 31/31855 |
| | | | | 714/727 |
| 2003/0083841 A1* | 5/2003 | Moore | ........... | G01R 31/318572 |
| | | | | 702/120 |
| 2006/0242487 A1* | 10/2006 | Baeg | ............... | G01R 31/2812 |
| | | | | 714/715 |
| 2010/0188097 A1* | 7/2010 | Sul | ............... | G01R 31/31717 |
| | | | | 324/537 |
| 2012/0081138 A1* | 4/2012 | Sul | ............... | G01R 31/31716 |
| | | | | 324/750.3 |
| 2014/0073269 A1* | 3/2014 | Lin | ............... | H04B 1/48 |
| | | | | 455/83 |
| 2014/0164858 A1* | 6/2014 | Luo | ............... | G01R 31/50 |
| | | | | 714/726 |
| 2015/0050900 A1* | 2/2015 | Zhang | ............... | H02M 1/08 |
| | | | | 455/127.1 |
| 2015/0215001 A1* | 7/2015 | Eaves | ............... | H04L 1/0033 |
| | | | | 375/224 |
| 2016/0011276 A1* | 1/2016 | Goma | ............... | H02J 50/05 |
| | | | | 324/764.01 |
| 2018/0375387 A1* | 12/2018 | Oshima | ............... | G01R 31/52 |

FOREIGN PATENT DOCUMENTS

| | | | | |
|---|---|---|---|---|
| WO | WO-9400771 A1 * | 1/1994 | ............ | G01R 31/58 |
| WO | WO-2014188510 A1 * | 11/2014 | ............ | H01L 23/642 |

* cited by examiner

# TEST SYSTEM, TRANSMITTING DEVICE, AND RECEIVING DEVICE CAPABLE OF PERFORMING MULTIPLE TESTS IN AC COUPLING MODE

BACKGROUND OF THE INVENTION

1. Field of the Invention

The present disclosure relates to a test system, transmitting device, and receiving device capable of performing multiple tests, especially to a test system, transmitting device, and receiving device capable of performing multiple tests in an AC coupling mode.

2. Description of Related Art

High-speed signal transmission usually uses a direct current (DC) coupling configuration or an alternating current (AC) coupling configuration. Regarding a DC coupling configuration, a transmitter is directly connected to a receiver; therefore, in this configuration both a DC signal and an AC signal can be transmitted successfully. Regarding an AC coupling configuration, a transmitter is connected to a receiver via a capacitor; therefore, in this configuration only an AC signal can be transmitted successfully. Communication protocols based on a DC coupling configuration include the High Definition Multimedia Interface (HDMI) protocol, and communication protocols based on an AC coupling configuration include the Peripheral Component Interconnect Express (PCI-E) protocol, the Universal Serial Bus (USB) protocol, and the DisplayPort (DP) protocol.

FIG. 1 shows a conventional test system used to test a transmitter based on an AC coupling configuration. The test system 100 of FIG. 1 includes a device under test (DUT) 110 (i.e., a transmitter here), a multiplexer 120, a capacitor 130, a receiver 140, and a testing device 150. When the test system 100 is used to test a transmitting function of the DUT 110, the multiplexer 120 electrically connects the DUT 110 to the receiver 140; when the test system 100 is used to test whether the DUT 100 has an open-circuited/short-circuited problem, the multiplexer 120 electrically connects the DUT 110 to the testing device 150.

FIG. 2 shows a conventional test system used to test a receiver based on an AC coupling configuration. The test system 200 of FIG. 2 includes a device under test (DUT) 210 (i.e., a receiver here), a multiplexer 220, a capacitor 230, a transmitter 240, and a testing device 250. When the test system 200 is used to test a receiving function of the DUT 210, the multiplexer 220 electrically connects the DUT 210 to the transmitter 240; when the test system 200 is used to test whether the DUT 200 has an open-circuited/short-circuited problem, the multiplexer 220 electrically connects the DUT 210 to the testing device 250.

In light of the above, a conventional test system of an AC coupling configuration requires a multiplexer to perform multiple tests (e.g., a test to check whether a transmitting/receiving function is normal and a test to check whether an open-circuited/short-circuited problem exists). However, this kind of conventional test systems has the following problems:

(1) The speed of signal transmission increases as technology advances, but the options of qualified multiplexers decrease as the requirement of speed increases.
(2) A multiplexer itself will cause additional transmission loss or reflection of a signal, and consequently deteriorate the test environment and drag down the production yield.

It should be noted that if one would like to carry out multiple tests based on the test system 100 and test system 200 without any multiplexer, the test system 100 of FIG. 1 should be replaced by two systems capable of performing a transmitting function test and an open-circuited/short-circuited test respectively, and the test system 200 of FIG. 1 should be replaced by two systems capable of performing a receiving function test and an open-circuited/short-circuited test respectively. Accordingly, the total number of test systems will increase and the total test time will get longer, which will increase the cost of test.

SUMMARY OF THE INVENTION

An object of the present disclosure is to disclose a test system, transmitting device, and receiving device capable of performing multiple tests in an alternating current (AC) mode and therefore improves the prior art.

An embodiment of the test system of the present disclosure includes a transmitter, a capacitor, and a receiver. The transmitter includes an output circuit, a transmitting circuit, a signal generator, and a comparing circuit. The output circuit includes a transmitter coupling terminal and a transmitter terminal, wherein the transmitter terminal is coupled to the receiver via the capacitor. The transmitting circuit is configured to transmit a predetermined transmission signal to the transmitter coupling terminal of the output circuit during a first test of the multiple tests. The signal generating circuit is configured to output a first test signal to the transmitter coupling terminal of the output circuit during a first process of a second test of the multiple tests, and output a second test signal to the transmitter coupling terminal of the output circuit during a second process of the second test. The comparing circuit is configured to compare a first signal from the transmitter coupling terminal with a reference signal during the first process of the second test and thereby obtain a first comparative result, and compare a second signal from the transmitter coupling terminal with the reference signal during the second process of the second test and thereby obtain a second comparative result, wherein the first comparative result and the second comparative result jointly determine whether the second test passes. The receiver includes an input circuit, a switch, and a receiving circuit. The input circuit includes a receiver coupling terminal and a receiver terminal, wherein the receiver terminal is coupled to the transmitter via the capacitor. The switch is coupled between the receiver coupling terminal and the receiving circuit, and configured to be turned on in the first test, turned off in the first process of the second test to avoid providing a discharging path for the capacitor, and turned on in the second process of the second test to try to provide the discharging path for the capacitor. The receiving circuit is configured to try to receive and process the predetermined transmission signal during the first test and thereby determine whether the first test passes; and the receiving circuit is further configured to try to provide the discharging path for the capacitor in the second process of the second test.

An embodiment of the transmitting device of the present disclosure includes an output circuit, a transmitting circuit, a signal generating circuit, and a comparing circuit. The output circuit includes a transmitter coupling terminal and a transmitter terminal, wherein the transmitter terminal is coupled to a receiver via a capacitor. The transmitting circuit is configured to transmit a predetermined transmission signal to the transmitter coupling terminal of the output circuit during a first test of the multiple tests. The signal generating circuit is configured to output a first test signal to the transmitter coupling terminal of the output circuit during a first process of a second test of the multiple tests, and output a second test signal to the transmitter coupling terminal of the output circuit during a second process of the second test. The comparing circuit is configured to compare a first signal from the transmitter coupling terminal with a reference signal during the first process of the second test and thereby obtain a first comparative result, and compare a second signal from the transmitter coupling terminal with the reference signal during the second process of the second test and thereby obtain a second comparative result, wherein the first comparative result and the second comparative result jointly determine whether the second test passes.

An embodiment of the receiving device of the present disclosure includes an input circuit, a switch, and a receiving circuit. The input circuit includes a receiver coupling terminal and a receiver terminal, wherein the receiver terminal is coupled to a transmitting device via a capacitor. The switch is coupled between the receiver coupling terminal and the receiving circuit, and configured to be turned on in a first test, turned off in a first process of a second test to avoid providing a discharging path for the capacitor, and turned on in a second process of the second test to try to provide the discharging path for the capacitor. The receiving circuit is configured to try to receive and process a predetermined transmission signal from the transmitting device during the first test and thereby determine whether the first test passes; and the receiving circuit is further configured to try to provide the discharging path for the capacitor in the second process of the second test.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present disclosure discloses a test system, transmitting device, and receiving device capable of performing multiple tests in an alternating current (AC) coupling mode. The system and devices can perform the multiple tests without any multiplexer, but the implementation of the present invention is not limited thereto.

Figure 1:
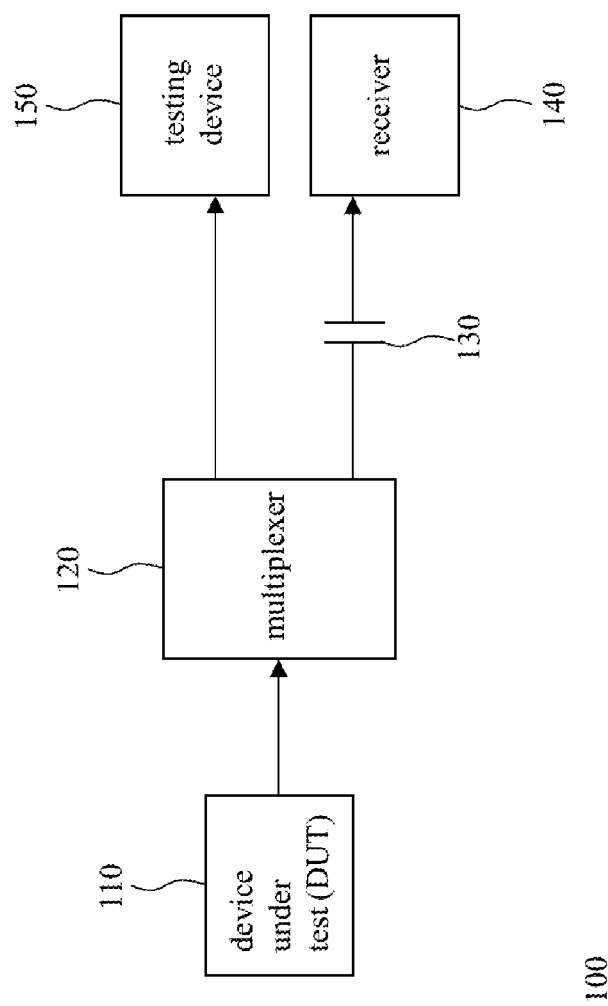
FIG. 1 shows a conventional test system used to perform multiple tests to a transmitter with a multiplexer.
Figure 2:
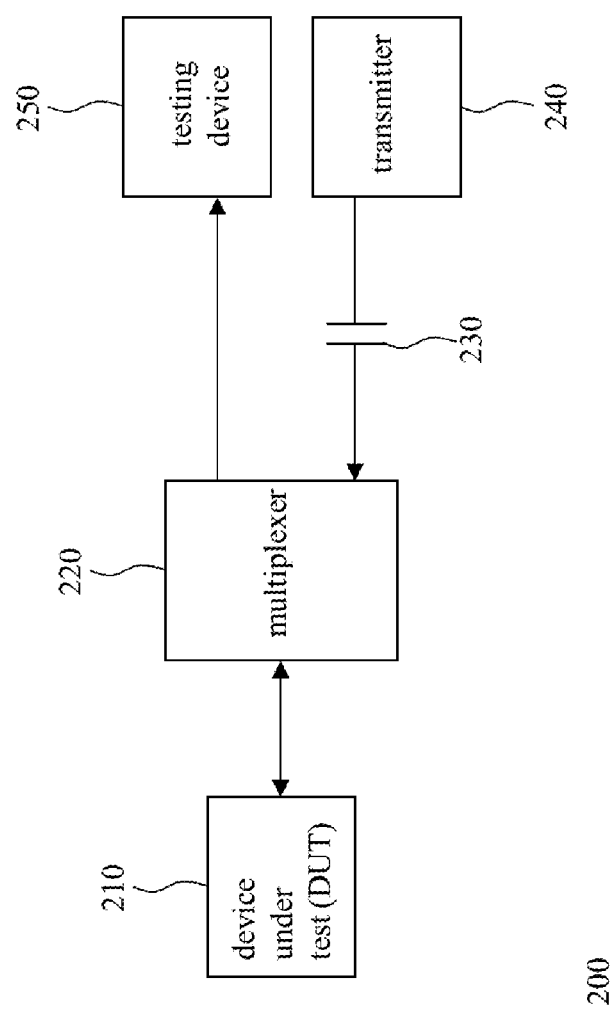
FIG. 2 shows a conventional test system used to perform multiple tests to a receiver with a multiplexer.
Figure 3:
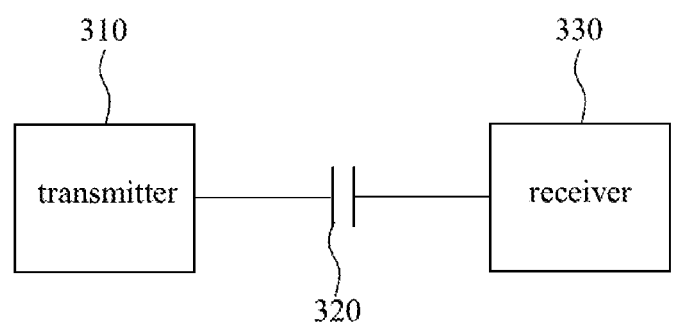
FIG. 3 shows an embodiment of the test system of the present disclosure.
Figure 4:
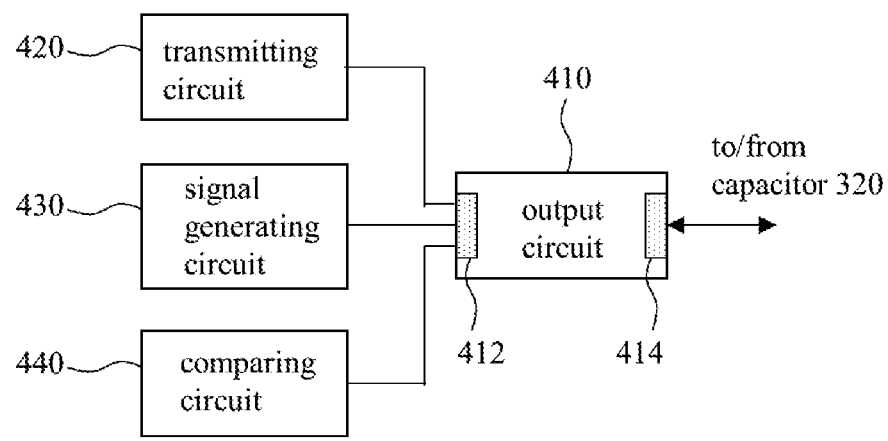
FIG. 4 shows an embodiment of the transmitter of FIG. 3.
Figure 5:
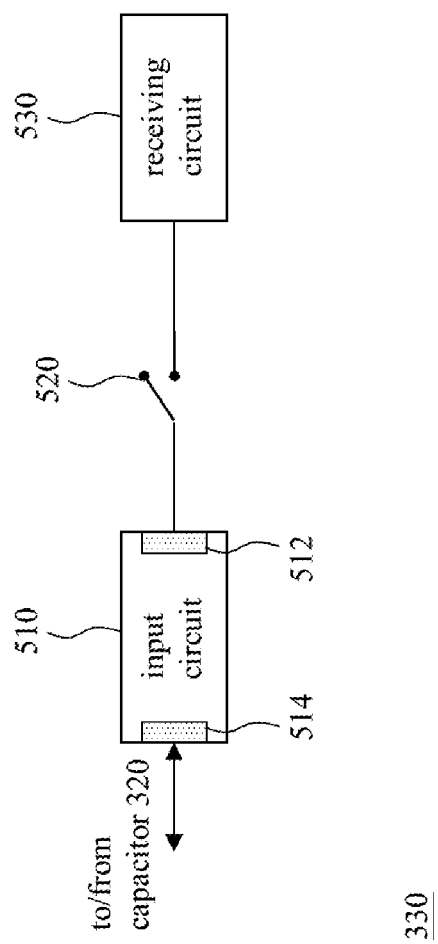
FIG. 5 shows an embodiment of the receiver of FIG. 3.

FIG. 3 shows an embodiment of the test system of the present disclosure. The test system 300 of FIG. 3 includes a transmitter 310, a capacitor 320, and a receiver 330, wherein one of the transmitter 310 and receiver 330 is treated as a device under test (DUT). FIG. 4 shows an embodiment of the transmitter 310 including an output circuit 410, a transmitting circuit 420, a signal generating circuit 430, and a comparing circuit 440. FIG. 5 shows an embodiment of the receiver 330 including an input circuit 510, a switch 520, and a receiving circuit 530.

Figure 8A:
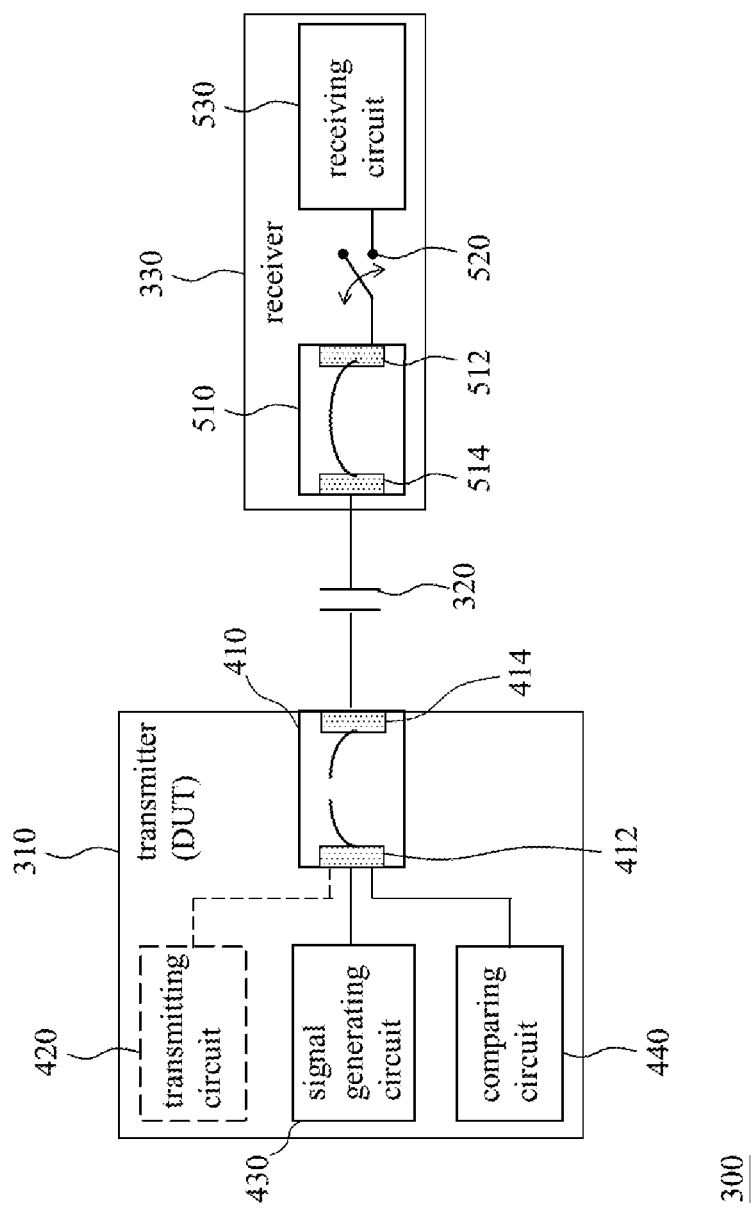
FIG. 8a shows the transmitter of FIG. 3 is in an open-circuited state.
Figure 8B:
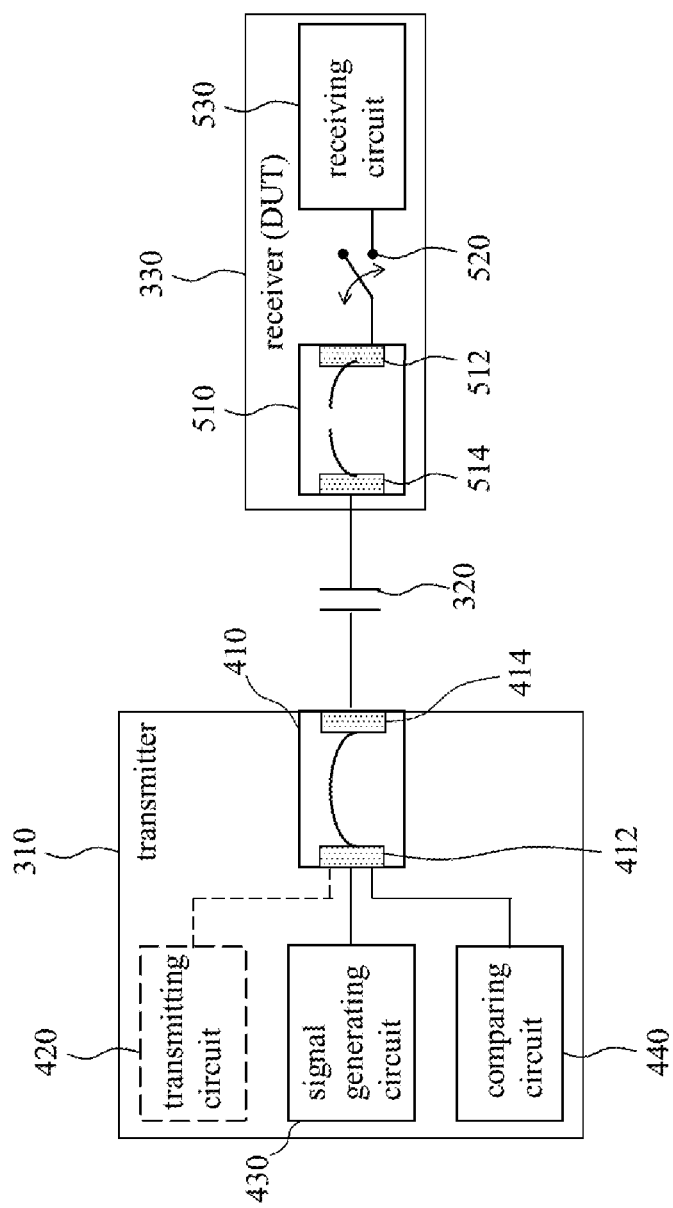
FIG. 8b shows the receiver of FIG. 3 is in an open-circuited state.
Figure 9A:
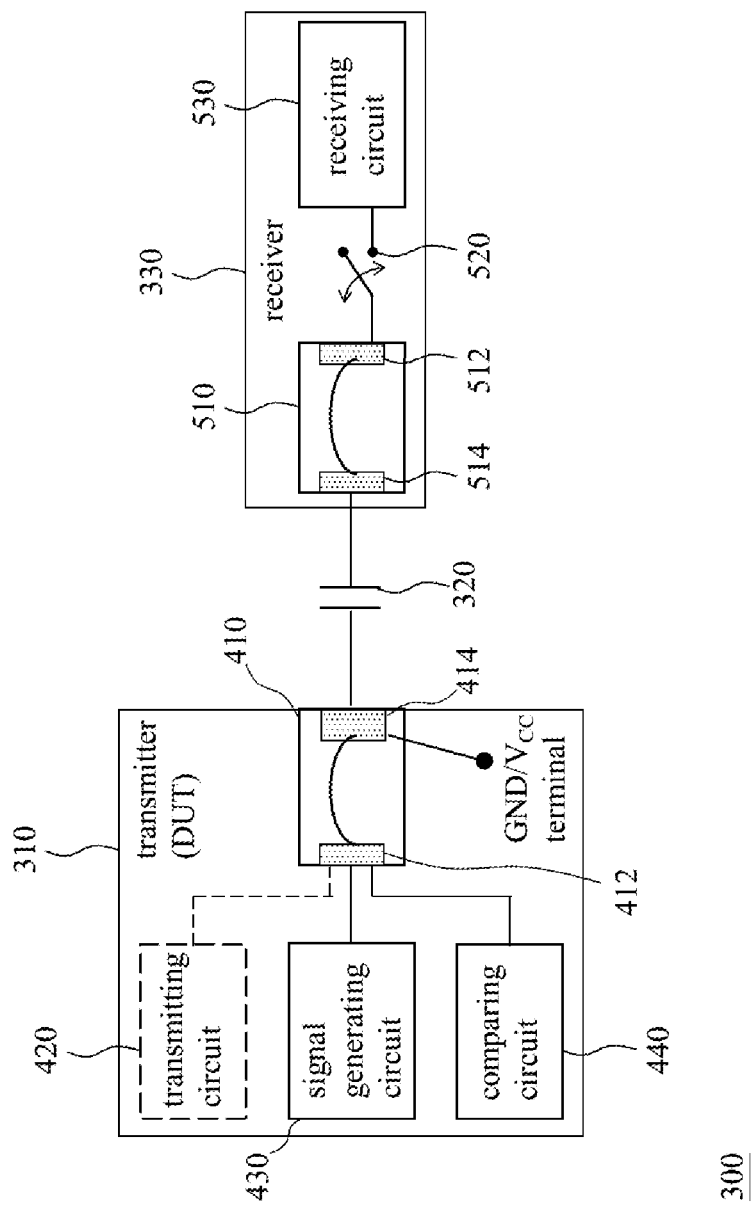
FIG. 9a shows the transmitter of FIG. 3 is in a short-circuited state.
Figure 9B:
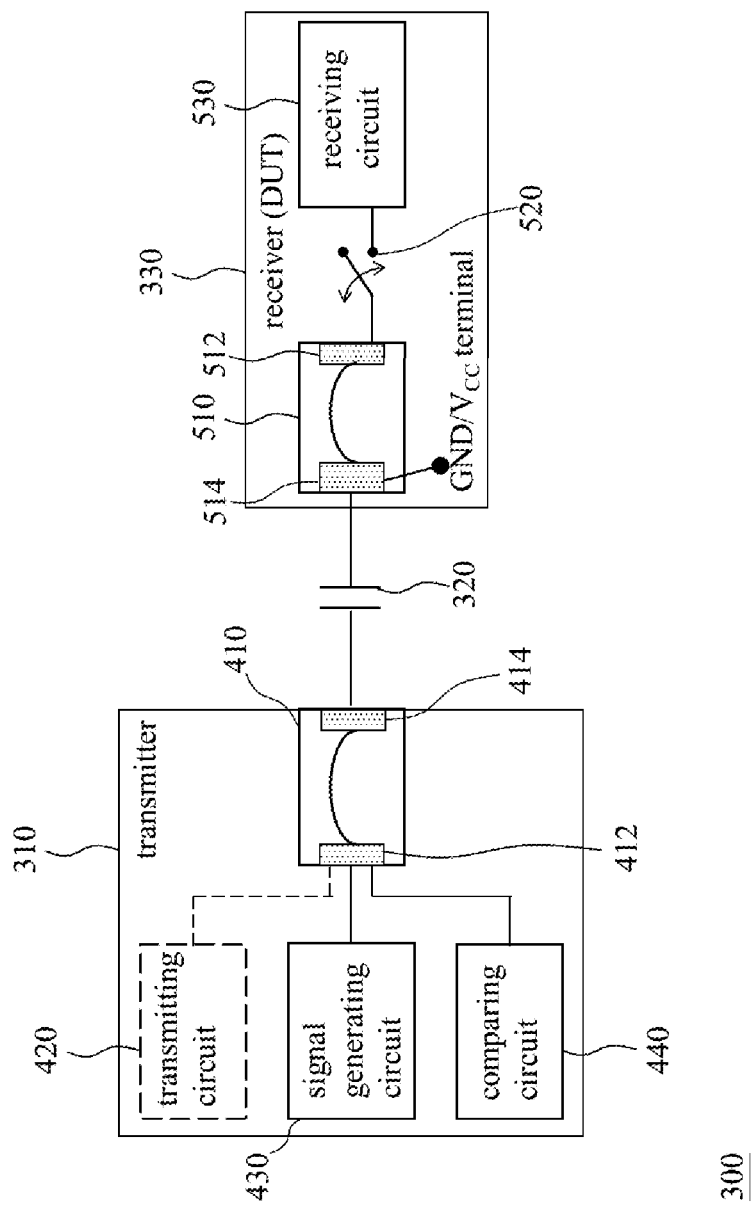
FIG. 9b shows the receiver of FIG. 3 is in a short-circuited state.

Please refer to FIGS. 3-5. The output circuit 410 includes a transmitter coupling terminal 412 (e.g., a contact pad) and a transmitter terminal 414 (e.g., a pin), wherein the transmitter terminal 414 is coupled to the receiver 330 via the capacitor 320. In a normal circumstance, the transmitter coupling terminal 412 and the transmitter terminal 414 are coupled to each other through a conductor (e.g., a bonding wire); if the conductor is missing, loosened, or improperly connected, the transmitter 310 may have an open-circuited problem as shown in FIG. 8a; and if a circuit component (e.g., the transmitter terminal 414) of the output circuit 410 is short-circuited to a ground terminal (GND terminal) or a power supply terminal ($V_{CC}$ terminal), the transmitter 310 may have a short-circuited problem as shown in FIG. 9a. Similarly, the input circuit 510 includes a receiver coupling terminal 512 (e.g., a contact pad) and a receiver terminal 514 (e.g., a pin), the receiver terminal 514 is coupled to the transmitter 310 via the capacitor 320, and in a normal circumstance the receiver coupling terminal 512 and the receiver terminal 514 are coupled to each other through a conductor (e.g., a bonding wire); if the conductor is missing, loosened, or improperly connected, the receiver 310 may have an open-circuited problem as shown in FIG. 8b; and if a circuit component (e.g., the receiver terminal 514) of the input circuit 510 is short-circuited to a ground terminal or a power supply terminal, the receiver 330 may have a short-circuited problem as shown in FIG. 9b.

Figure 6:
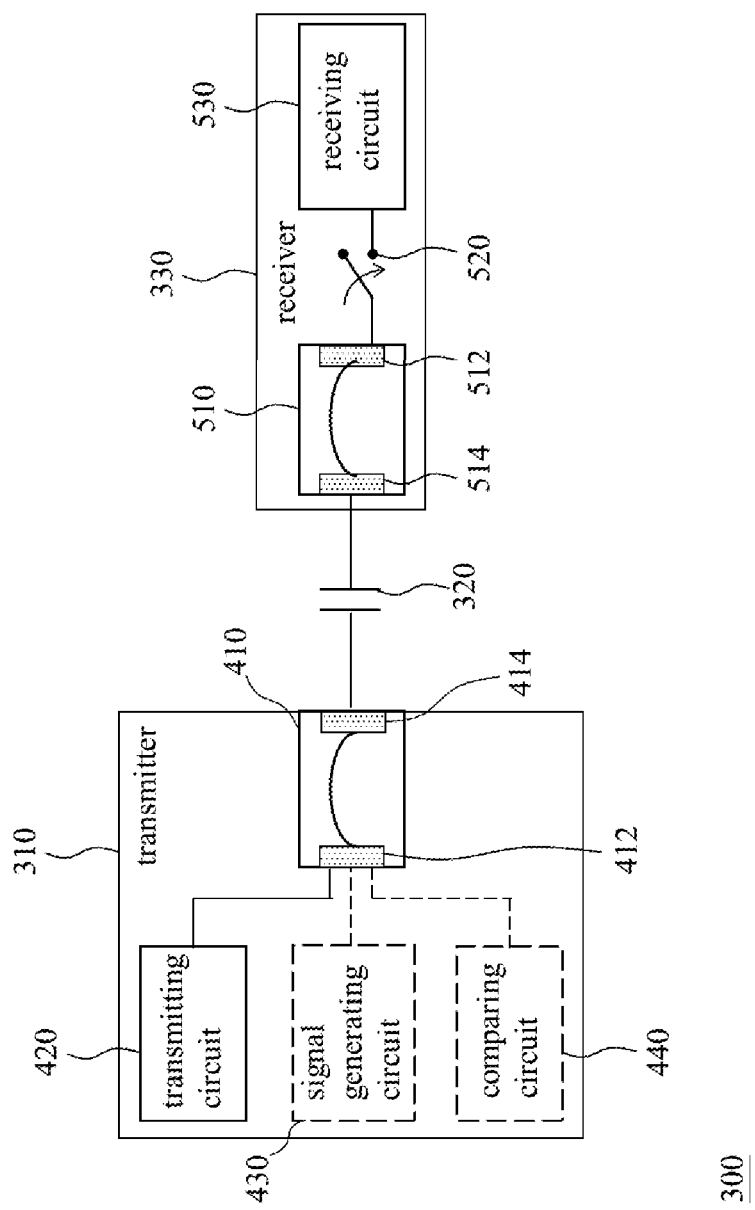
FIG. 6 shows the test system of FIG. 3 performing a first test.

Please refer to FIGS. 3-5. In a first test (e.g., a test to check whether a transmitting/receiving function is regular), the switch 520 is turned on, that is to say conducting electricity, and the transmitting circuit 420 transmits a predetermined transmission signal (e.g., a signal having a predetermined pattern) to the transmitter coupling terminal 412 of the output circuit 410; meanwhile, the signal generating circuit 430 and the comparing circuit 440 may be disabled or have no substantial influence on the signal of the transmitter coupling terminal 412 as shown in FIG. 6, the dashed lines therein especially. If both the transmitter 310 and receiver 330 have no open-circuited and short-circuited problems, the receiving circuit 530 can successfully receive and process the predetermined transmission signal to determine whether the content and quality of the predetermined transmission signal meet a predetermined requirement (e.g., a requirement requesting the encoding pattern of the received predetermined transmission signal to conform to the encoding pattern of a prestored/known predetermined transmission signal) and thereby generate the result of the first test indicative of whether the first test passes. If the transmitter 310 is treated as the DUT and the first test passes, the transmitting function of the transmitter 310 is found normal and reliable; and if the receiver 330 is treated as the DUT and the first test passes, the receiving function of the receiver 330 is found normal and reliable. Each of the transmitting circuit 420 and receiving circuit 530 is a known or self-developed circuit, and the detail is omitted here. It should be noted that the receiving circuit 530 includes an impedance (not shown but well known); this impedance can assist the capacitor 320 in discharging electricity and it usually matches the characteristic impedance of the transmission line between the transmitter 310 and receiver 330.

Figure 7A:
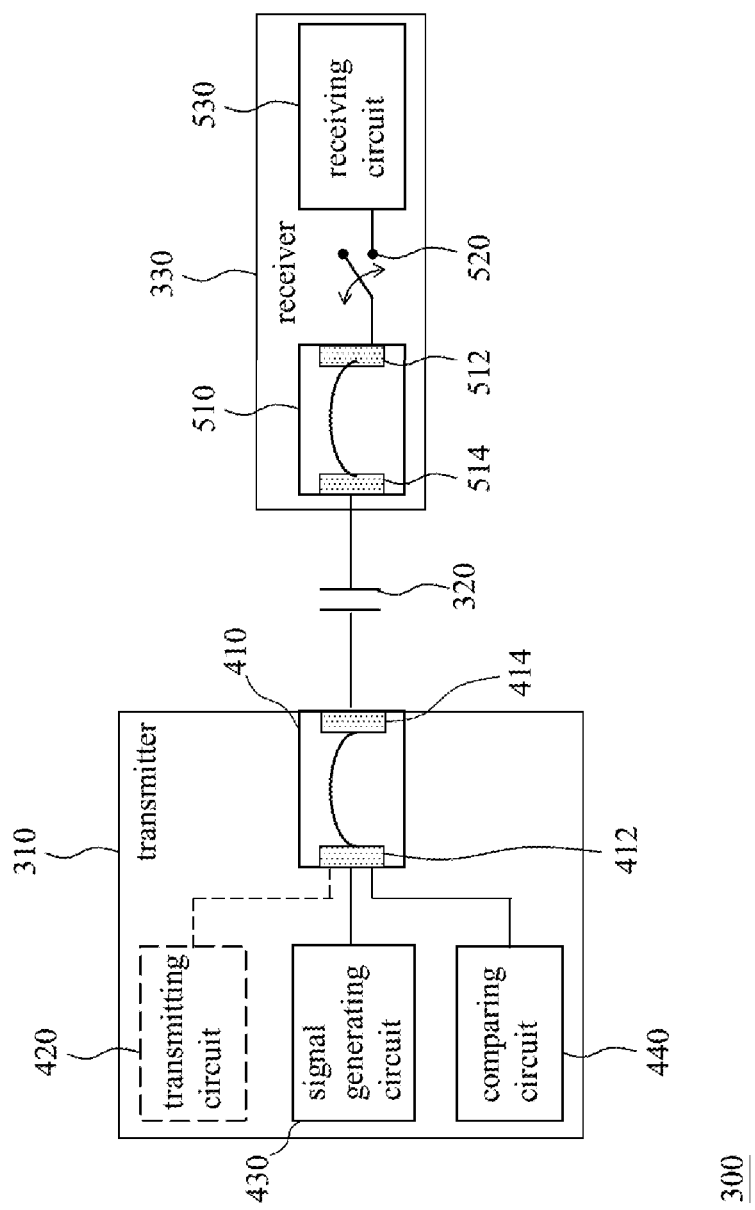
FIG. 7a shows a device under test (DUT) is in a normal state.

Please refer to FIGS. 3-5. In a first process of a second test (e.g., a test to find out whether an open-circuit and/or a short-circuit exist), the switch 420 is turned off, the signal generating circuit 430 outputs a first test signal (e.g., an impulse voltage V2) to the transmitter coupling terminal 412 of the output circuit 410, and then the comparing circuit 440 compares a first signal (e.g., the current voltage of the transmitter coupling terminal 412) from the transmitter coupling terminal 412 with a reference signal (e.g., a reference voltage V3) to obtain a first comparative result R. In a second process of the second test, the switch 420 is turned on, the signal generating circuit 430 outputs a second test signal (e.g., the aforementioned impulse voltage V2) to the transmitter coupling terminal 412 of the output circuit 410, and then the comparing circuit 440 compares a second signal (e.g., the current voltage of the transmitter coupling terminal 412) from the transmitter coupling terminal 412 with the reference signal (e.g., the aforementioned reference voltage V3) to obtain a second comparative result R2. The first comparative result R1 and second comparative result R2 jointly determine whether the second test passes. If the second test passes, it shows that the DUT has neither open-circuited problems nor short-circuited problems; and if the second test fails, it shows that the DUT has an open-circuited problem and/or a short-circuited problem. It should be noted that the transmitting circuit 420 is disabled or outputs no signals that are strong enough to affect the second test to the transmitter coupling terminal 412 as shown in FIGS. 7a, 8a, and 9a, the dashed lines therein especially.

According to the preceding paragraphs, the result of the second test indicates that the DUT (i.e., the transmitter 310 or the receiver 330) is in a normal state, an open-circuited sate, or a short-circuited state provided that the other device that is not under test functions normally. The above-mentioned states are detailed below.

Figure 7B:
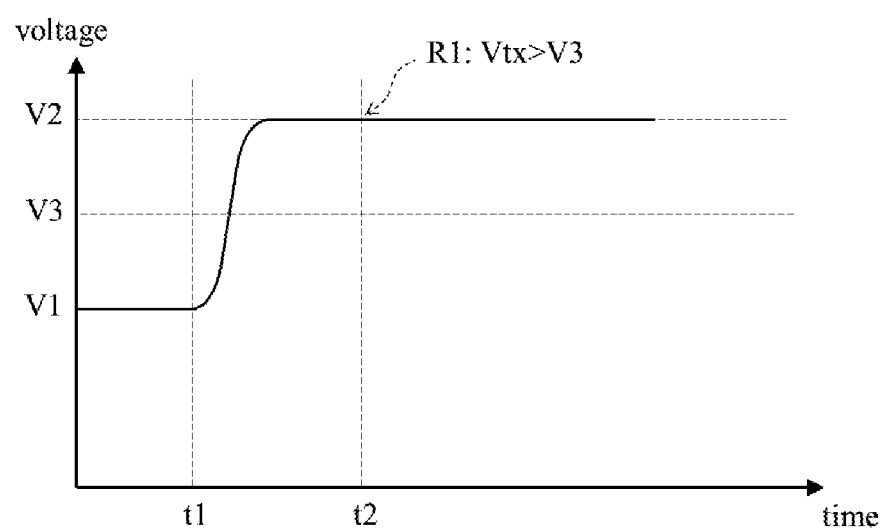
FIG. 7b illustrates the voltage variation of the transmitter coupling terminal of FIG. 7a in a first process of a second test.
Figure 7C:
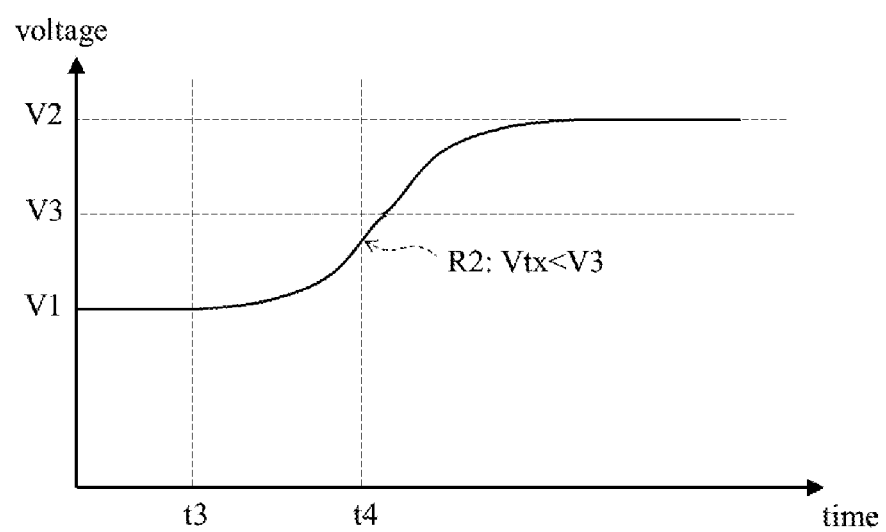
FIG. 7c illustrates the voltage variation of the transmitter coupling terminal of FIG. 7a in a second process of the second test.

(1) Normal state: FIG. 7a shows that the DUT is in the normal state; FIG. 7b illustrates the variation of the voltage Vtx of the transmitter coupling terminal 412 in the first process of the second test; and FIG. 7c illustrates the variation of the voltage Vtx of the transmitter coupling terminal 412 in the second process of the second test. As shown in FIG. 7a and FIG. 7b, the voltage Vtx of the transmitter coupling terminal 412 is V1 in the beginning; at a time point t1, the first process of the second test starts, then the switch 520 is turned off (nonconducting) and the signal generating circuit 430 outputs a voltage V2 to the transmitter coupling terminal 412, wherein since the switch 520 is turned off, the voltage V2 charges the capacitor 320 quickly and thereby makes the voltage Vtx of the transmitter coupling terminal 412 reach the voltage V2 quickly; afterward the voltage Vtx of the transmitter coupling terminal 412 reaches the voltage V2 at a time point t2, and then the comparing circuit 440 compares the voltage Vtx of the transmitter coupling terminal 412 with a reference voltage V3 (e.g., V1<V3<V2) to obtain the first comparative result R1 (i.e., Vtx> V3 in this case). Additionally, as shown in FIG. 7a and FIG. 7c, the voltage Vtx of the transmitter coupling terminal 412 is V1 in the beginning; at a time point t3 the second process of the second test starts, and then the switch 520 is turned on (conducting) and the signal generating circuit 430 outputs the voltage V2 to the transmitter coupling terminal 412, wherein since the switch 520 is turned on, the capacitor 320 discharges electricity to the receiving circuit 530 via the switch 520 while the voltage V2 charges the capacitor 320, and this makes the voltage Vtx of the transmitter coupling terminal 412 reach the voltage V2 slowly; afterward, the voltage Vtx of the transmitter coupling terminal 412 does not reach the reference voltage V3 yet at a time point t4, and in the meantime the comparing circuit 440 compares the voltage Vtx of the transmitter coupling terminal 412 with the reference voltage V3 to obtain the second comparative result R2 (i.e., Vtx<V3 in this case). In light of the above, the first comparative result R1 (Vtx> V3) is different from the second comparative result (Vtx<V3), and this shows that the DUT is in the normal state as summarized in the Table 1 below. In an exemplary implementation, the interval between the time point t1 and time point t2 is predetermined and the interval between the time point t3 and time point t4 is also predetermined; more specifically, the two intervals are determined in advance according to the time constant in regard to the capacitor 320. In an exemplary implementation, the interval |t1-t2| is equal to the interval |t3-t4|.

Figure 8C:
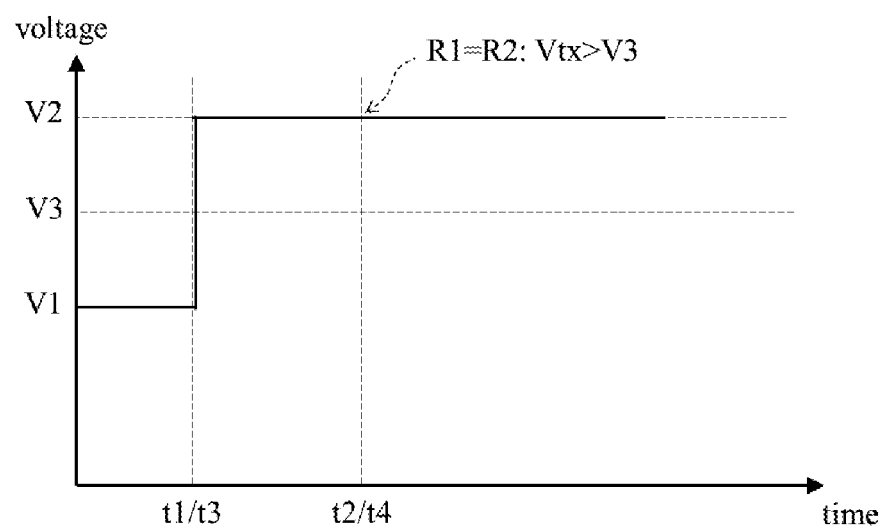
FIG. 8c illustrates the voltage variation of the transmitter coupling terminal of FIG. 8a in the first process and second process of the second test.
Figure 8D:
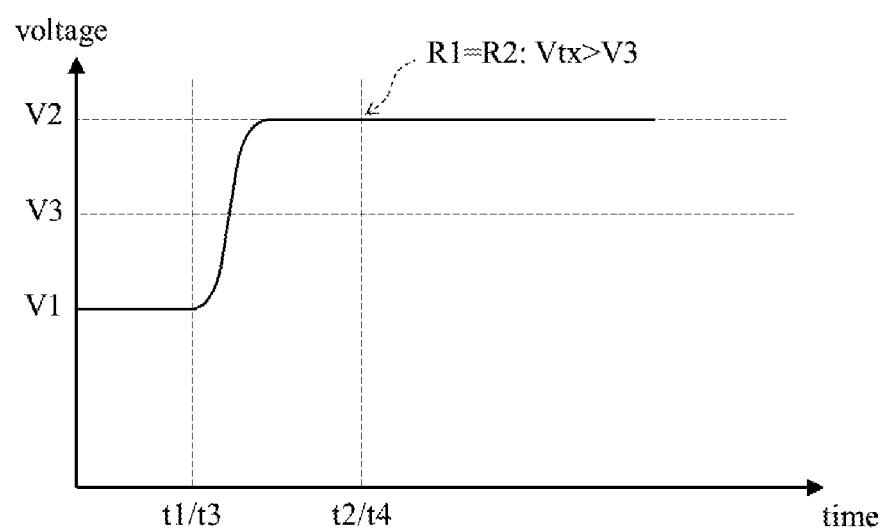
FIG. 8d illustrates the voltage variation of the transmitter coupling terminal of FIG. 8b in the first process and second process of the second test.

(2) Open-circuited state: FIG. 8a shows that the transmitter 310 (i.e., the DUT here) is in the open-circuited state; FIG. 8b shows that the receiver 330 (i.e., the DUT here) is in the open-circuited state; FIG. 8c illustrates the variation of the voltage Vtx of the transmitter coupling terminal 412 of FIG. 8a in the first process and second process of the second test; and FIG. 8d illustrates the variation of the voltage Vtx of the transmitter coupling terminal 412 of FIG. 8b in the first process and second process of the second test. As shown in FIGS. 8a-8d, the voltage Vtx of the transmitter coupling terminal 412 is V1 in the beginning; the first/second process of the second test starts at a time point t1/t3, then the switch 520 is turned off/on and the signal generating circuit 430 outputs a voltage V2 to the transmitter coupling terminal 412, wherein since the path between the transmitter coupling terminal 412 and the transmitter terminal 414 is nonconducting due to an open circuit included in this path or the path between the receiver coupling terminal 512 and the receiver terminal 514 is nonconducting due to an open circuit included in this path, the voltage Vtx of the transmitter coupling terminal 412 reaches the voltage V2 quickly regardless of the switch 520 being conducting or nonconducting; afterward the comparing circuit 440 compares the voltage Vtx of the transmitter coupling terminal 412 with the reference voltage V3 at a time point t2/t4 to obtain the first comparative result R1/second comparative result R2 (i.e., Vtx> V3 in this case). Accordingly, the first comparative result R1 (Vtx> V3) is the same as the second comparative result (Vtx> V3), and this shows that the DUT is in an abnormal state (i.e., the open-circuited state here) as summarized in the Table 1 below.

Figure 9C:
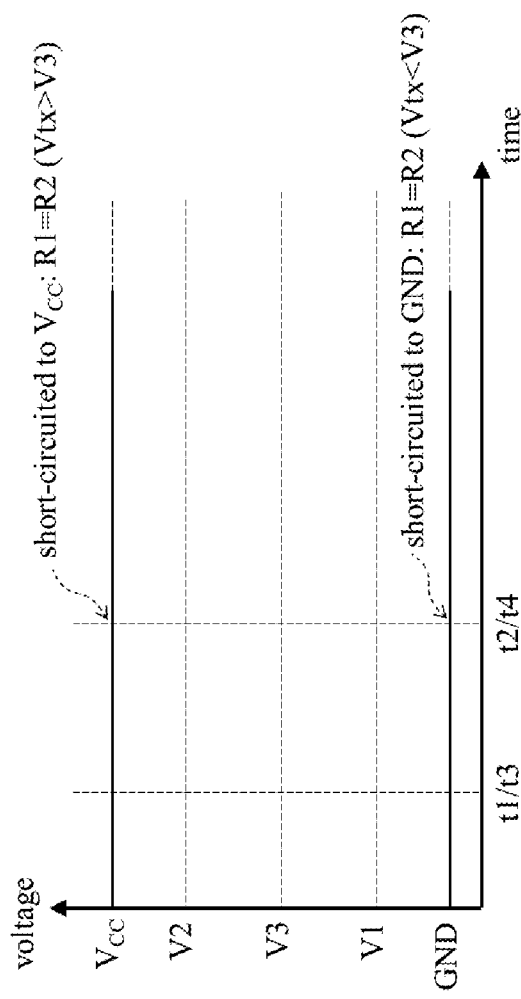
FIG. 9c illustrates the voltage variation of the transmitter coupling terminal of FIGS. 9b-9a in the first process and second process of the second test.

(3) Short-circuited state: FIG. 9a shows that the transmitter 310 (i.e., the DUT here) is in the short-circuited state; FIG. 9b shows that the receiver 330 (i.e., the DUT here) is in the short-circuited state; and FIG. 9c illustrates the variation of the voltage Vtx of the transmitter coupling terminal 412 of FIGS. 9a-9b in the first process and second process of the second test. As shown in FIGS. 9a-9c where the DUT (i.e., the transmitter 310 or the receiver 330) is in the short-circuited state, if the DUT is short-circuited to a ground terminal (GND terminal), the voltage Vtx of the transmitter coupling terminal 412 remains at a grounding voltage GND, and in this circumstance the first comparative result R1 and second comparative result R2 obtained by the comparing circuit 440 comparing the voltage Vtx of the transmitter coupling terminal 412 with the reference voltage V3 at a time point t2 and time point t4 respectively are the same (i.e., Vtx<V3); and if the DUT is short-circuited to a power supply terminal ($V_{CC}$ terminal), the voltage Vtx of the transmitter coupling terminal 412 remains at a power supply voltage $V_{CC}$, and in this circumstance the first comparative result R1 and second comparative result R2 obtained by the comparing circuit 440 comparing the voltage Vtx of the transmitter coupling terminal 412 with the reference voltage V3 at the time point t2 and time point t4 respectively are the same (i.e., Vtx> V3). As a result, the first comparative result R1 (Vtx> V3 or Vtx<V3) is the same as the second comparative result (Vtx> V3 or Vtx<V3), and this shows that the DUT is in an abnormal state (i.e., the short-circuited state here) as summarized in the Table 1 below.

TABLE 1

| comparative results for V2 > V3 > V1 | first comparative result R1 (switch 520 being nonconducting) | second comparative result R2 (switch 520 being conducting) |
|---|---|---|
| normal state | Vtx > V3 | Vtx < V3 |
| open-circuited state | Vtx > V3 | Vtx > V3 |
| state of being short-circuited to ground terminal | Vtx < V3 | Vtx < V3 |
| state of being short-circuited to power supply terminal | Vtx > V3 | Vtx > V3 |

In an alternative embodiment, the voltage V2 is lower than the voltage V1, the voltage V3 is between the voltage V2 and voltage V1 (i.e., V1> V3> V2), and the first comparative result R1 and comparative result R2 in regard to the above-mentioned voltages are shown in the Table 2 below. Since those having ordinary skill in the art can refer to the disclosure of the embodiments of FIGS. 3-9c to appreciate the detail and modification of this alternative embodiment, repeated and redundant description is omitted here. It should be noted that people of ordinary skill in the art can determine the voltages V2 and V3 and the time intervals |t1-t2| and |t3-t4| in accordance with the demand for implementation and the capacitance of the capacitor 320, and thereby make the first comparative result R1 and second comparative result R2 be adequate to indicate whether the DUT is normal or not. It should also be noted that no multiplexer exists between the transmitter 310 and the receiver 330 in the aforementioned embodiments; the transmitter 310 of FIG. 3 itself is a transmitting device capable of performing multiple tests in an AC mode; and the receiver 330 of FIG. 3 itself is a receiving device capable of performing multiple tests in an AC mode.

TABLE 2

| comparative results for V2 > V3 > V1 | first comparative result R1 (switch 520 being nonconducting) | second comparative result R2 (switch 520 being conducting) |
|---|---|---|
| normal state | Vtx < V3 | Vtx > V3 |
| open-circuited state | Vtx < V3 | Vtx < V3 |
| state of being short-circuited to ground terminal | Vtx < V3 | Vtx < V3 |
| state of being short-circuited to power supply terminal | Vtx > V3 | Vtx > V3 |

It should be noted that people of ordinary skill in the art can selectively use some or all of the features of any embodiment in this specification or selectively use some or all of the features of multiple embodiments in this specification to implement the present invention as long as such implementation is practicable, which implies that the present invention can be carried out flexibly.

To sum up, the test system, transmitting device, and receiving device of the present disclosure can perform multiple tests without any multiplexer. In comparison with the prior art, the present invention is not only easy to be implemented but also cost-effective.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A test system capable of performing multiple tests in an alternating current (AC) coupling mode, comprising:
    a transmitter including:
        an output circuit including a transmitter coupling terminal and a transmitter terminal, wherein the transmitter terminal is coupled to a receiver via a capacitor;
        a transmitting circuit configured to transmit a predetermined transmission signal to the transmitter coupling terminal of the output circuit during a first test of the multiple tests;
        a signal generating circuit configured to output a first test signal to the transmitter coupling terminal of the output circuit during a first process of a second test of the multiple tests, and configured to output a second test signal to the transmitter coupling terminal of the output circuit during a second process of the second test; and
        a comparing circuit configured to compare a first signal from the transmitter coupling terminal with a reference signal during the first process of the second test and thereby obtain a first comparative result, and configured to compare a second signal from the transmitter coupling terminal with the reference signal during the second process of the second test and thereby obtain a second comparative result, wherein the first comparative result and the second comparative result jointly determine whether the second test passes;
the capacitor; and
the receiver including:
an input circuit including a receiver coupling terminal and a receiver terminal, wherein the receiver terminal is coupled to the transmitter via the capacitor;
a switch coupled between the receiver coupling terminal and a receiving circuit, and configured to be turned on in the first test, turned off in the first process of the second test to avoid providing a discharging path for the capacitor, and turned on in the second process of the second test to provide the discharging path for the capacitor; and
the receiving circuit configured to receive and process the predetermined transmission signal during the first test and thereby determine whether the first test passes, and configured to provide the discharging path for the capacitor in the second process of the second test.

2. The test system of claim 1, wherein one of the transmitter and the receiver is a device under test (DUT), the first test is for determining whether a function of the DUT meets a predetermined requirement, and the second test is for determining whether the DUT includes an open circuit or a short circuit.

3. The test system of claim 1, wherein the first test signal, the second test signal, the first signal, the second signal, and the reference signal are voltage signals.

4. The test system of claim 1, wherein the signal generating circuit outputs the first test signal at a first time point, the comparing circuit compares the first signal with the reference signal at a second time point, the signal generating circuit outputs the second test signal at a third time point, the comparing circuit compares the second signal with the reference signal at a fourth time point, an interval between the first time point and the second time point is equal to a first predetermined length of time, and an interval between the third time point and the fourth time point is equal to a second predetermined length of time.

5. The test system of claim 4, wherein the first predetermined length of time is equal to the second predetermined length of time.

6. The test system of claim 1, wherein the second test passes on condition that the first comparative result is different from the second comparative result.

7. The test system of claim 6, wherein the second test fails on condition that the first comparative result is the same as the second comparative result.

8. The test system of claim 1, wherein the transmitter is coupled to the receiver without any multiplexer in the first test and the second test.

9. A transmitting device capable of performing multiple tests in an alternating current coupling mode (AC coupling mode), comprising:
an output circuit including a transmitter coupling terminal and a transmitter terminal, wherein the transmitter terminal is coupled to a receiver via a capacitor;
a transmitting circuit configured to transmit a predetermined transmission signal to the transmitter coupling terminal of the output circuit during a first test of the multiple tests;
a signal generating circuit configured to output a first test signal to the transmitter coupling terminal of the output circuit during a first process of a second test of the multiple tests, and configured to output a second test signal to the transmitter coupling terminal of the output circuit during a second process of the second test; and
a comparing circuit configured to compare a first signal from the transmitter coupling terminal with a reference signal during the first process of the second test and thereby obtain a first comparative result, and configured to compare a second signal from the transmitter coupling terminal with the reference signal during the second process of the second test and thereby obtain a second comparative result, wherein the first comparative result and the second comparative result jointly determine whether the second test passes.

10. The transmitting device of claim 9, wherein the first test is for determining whether a function of the transmitting circuit meets a predetermined requirement, and the second test is for determining whether the output circuit includes an open circuit or a short circuit.

11. The transmitting device of claim 9, wherein the first test signal, the second test signal, the first signal, the second signal, and the reference signal are voltage signals.

12. The transmitting device of claim 9, wherein the signal generating circuit outputs the first test signal at a first time point, the comparing circuit compares the first signal with the reference signal at a second time point, the signal generating circuit outputs the second test signal at a third time point, the comparing circuit compares the second signal with the reference signal at a fourth time point, an interval between the first time point and the second time point is equal to a first predetermined length of time, and an interval between the third time point and the fourth time point is equal to a second predetermined length of time.

13. The transmitting device of claim 12, wherein the first predetermined length of time is equal to the second predetermined length of time.

14. The transmitting device of claim 9, wherein the second test passes on condition that the first comparative result is different from the second comparative result.

15. The transmitting device of claim 14, wherein the second test fails on condition that the first comparative result is the same as the second comparative result.

16. The transmitting device of claim 9, wherein the transmitter coupling terminal is coupled to the receiver without any multiplexer in the first test and the second test.

17. The transmitting device of claim 9, wherein the transmitter coupling terminal is a contact pad and the transmitter terminal is an output pin.

18. A receiving device capable of performing multiple tests in an alternating current coupling mode (AC coupling mode), comprising:
an input circuit including a receiver coupling terminal and a receiver terminal, wherein the receiver terminal is coupled to a transmitting device via a capacitor;
a switch coupled between the receiver coupling terminal and a receiving circuit, and configured to be turned on in a first test, turned off in a first process of a second test to avoid providing a discharging path for the capacitor, and turned on in a second process of the second test to provide the discharging path for the capacitor; and
the receiving circuit configured to receive and process a predetermined transmission signal from the transmitting device during the first test and thereby determine whether the first test passes, and configured to provide the discharging path for the capacitor in the second process of the second test.

19. The receiving device of claim 18, wherein the first test is for determining whether a function of the receiving circuit meets a predetermined requirement, and the second test is for determining whether the input circuit includes an open circuit or a short circuit.

20. The receiving device of claim 18, wherein the switch is coupled to the transmitting device without any multiplexer in the first test and the second test.

* * * * *